United States Patent [19]
Kiziloglu et al.

[11] Patent Number: 6,074,569
[45] Date of Patent: Jun. 13, 2000

[54] STRIPPING METHOD FOR PHOTORESIST USED AS MASK IN $CH_4/H_2$ BASED REACTIVE ION ETCHING (RIE) OF COMPOUND SEMICONDUCTORS

[75] Inventors: Kursad Kiziloglu, Oxnard; Ming Hu, Rancho Palos Verdes, both of Calif.

[73] Assignee: Hughes Electronics Corporation, El Segundo, Calif.

[21] Appl. No.: 08/987,458

[22] Filed: Dec. 9, 1997

[51] Int. Cl.$^7$ ........................................................ B44C 1/22
[52] U.S. Cl. ................................ 216/62; 216/64; 216/66; 216/67; 438/708; 438/725; 438/735
[58] Field of Search ..................................... 438/690, 708, 438/709, 718, 725, 734; 216/12, 41, 62, 64, 65, 66, 67

[56] References Cited

U.S. PATENT DOCUMENTS

| | | | |
|---|---|---|---|
| 4,594,769 | 6/1986 | Ellwanger ................................ | 438/453 |
| 4,705,597 | 11/1987 | Gimpleson et al. ..................... | 438/701 |
| 4,816,115 | 3/1989 | Horner et al. ........................... | 438/623 |
| 5,064,748 | 11/1991 | Bobbio .................................... | 430/311 |
| 5,229,258 | 7/1993 | Sezi et al. ............................... | 430/325 |
| 5,358,599 | 10/1994 | Cathey et al. ........................... | 438/701 |
| 5,454,906 | 10/1995 | Baker et al. .............................. | 216/66 |
| 5,501,926 | 3/1996 | Cheng et al. ................................ | 430/5 |
| 5,567,271 | 10/1996 | Chu et al. . | |
| 5,658,697 | 8/1997 | Lin ............................................ | 430/7 |

OTHER PUBLICATIONS

R. Allen et al., Deep U.V. Hardening of Positive Photoresist Patterns. J. Electrochem. Soc., vol. 129, No. 6, pp. 1379–1381 (1982).

C. Constantine et al., Plasma Etching of III–V Semiconductors in CH4/H2/Ar Electron Cyclotron Resonance Discharges, J. Vac. Sci. Tech., vol. 8, No. 4, pp. 596–606 (1990).

J.W. Lee et al., Comparison of Masking Materials for High Microwave Power CH4/H2/Ar Etching of III–V Semiconductors, J. Vac. Sci. Tech., vol. 14, No. 3, pp. 1752–1757 (1996).

E. Gogolides et al., A New Method Which Increases the Si Content in Wet Sylation, and its Relation to the Thermal Effects During O2 Plasma Development, Micro, Eng., vol. 27, pp. 381–384 (1995).

J. Kaindl et al., Dry Etching of III/V Semiconductors; Fine Tuning of Pattern Transfer and Process Control, J. Electrochem. Soc., vol. 142, No. 7 pp. 2418–2424 (1995).

L. Peters, Stripping Today's Toughest Resists, Semiconductor International, pp. 58–64 (1992).

J.E. Schramm et al., Highly Selective Reactive Ion Etch Process for InP–based Device Fabricator Using Methane/Hydrogen/Argon, J. Vac. Sci. Tech. vol. 11, No. 6, pp. 2280–2283 (1993).

J.E. Schramm, Reactive Ion Etching of Indium–based Compounds Using Methane/Hydrogen/Argon, Dissertation, University of California, Santa Barbara, pp. 67–86 (1995).

Schramm, J.E., "Reactive Ion Etching of Indium–based Compounds Using Methane/Hydrogen/Argon" A Dissertation, Univ. of Ca., Santa Barbara, Jun. 1995 pp. 67–86.

Peters, L., Stripping Today's Toughest Resist' Semiconductor International, 1992 pp. 58–64.

Schramm, J.E., et al., "Highly selective reactive ion etch process for In–P–based device fabrication using methane/hydrogen/argon" J. Vac. Sci. Technol. B 11(6), (1993) pp. 2280–2283.

Constantine, C., et al. "Plasma etching of III–V semiconductors in $CH_4$ $H_2$/Ar electron cyclotron resonance discharges" J. Vac. Sci. Technol. B 8(4), (1990) pp. 596–606.

Lee, J.W., et al. "Comparison of masking materials for high microwave power $Ch_4/H_2$/Ar etching of III–V semiconductors" J. Vac. Sci. Technol. B *14(3), (1996) pp. 1752–1757.

Ren, F., et al. "Reduction of sidewall roughness during dry etching of $SiO_2$ " J. Vac. Sci. Technol. B 10(6) (1992) pp. 2407–2411.

Gogolides, E., et al. "A new method which increases the Si content in wet silylation, and its relation to the thermal effects during $O_2$ plasma development" Microelectronic Engineering (1995) pp. 381–384.

*Primary Examiner*—Randy Gulakowski
*Assistant Examiner*—Allan Olsen
*Attorney, Agent, or Firm*—V. D. Duraiswamy; M.W. Sales

[57] ABSTRACT

A method for stripping photoresist used as an etch mask in carbon based reactive ion etching includes flood exposing a patterned photoresist with a light and cyclically exposing the photoresist with an oxygen plasma in between the carbon based plasma. The step of cyclically exposing occurs after the step of flood exposing. The step of flood exposing includes the step of decomposing photosensitive compounds in the photoresist, while the step of cyclically exposing includes the step of cyclically removing layers of the photoresist.

21 Claims, No Drawings

STRIPPING METHOD FOR PHOTORESIST USED AS MASK IN CH$_4$/H$_2$ BASED REACTIVE ION ETCHING (RIE) OF COMPOUND SEMICONDUCTORS

BACKGROUND OF THE INVENTION

1. Field of the Invention

The present invention generally relates to methods for removing a photoresist mask from an etched substrate. More specifically, the present invention relates to an improved method for stripping a photoresist mask used in CH$_4$/H$_2$ reactive ion etching (RIE) of semiconductors, particularly those based on InP and GaAs.

2. Description of Related Art

The efficient and effective removal of photoresist masks used during the reactive ion etching process of semiconductors continues to be of concern. Harsher stripping methods have been needed as photoresist masks have become harder to remove. These harder photoresists have come about both intentionally and unintentionally. An intentionally hardened photoresist may be desirable, as indicated by Allen et al., "Deep U.V. Hardening of Positive Photoresist Patterns." J. Electrochemical Soc., Vol. 129, No. 6, pp. 1379–1381 (1982). Therein, deep U.V. curing by flood exposure was employed for the purpose of making the photoresist less susceptible to thermal deformation.

More frequently, a harder photoresist is created unintentionally. That is often due to the photoresist being subjected to harsh semiconductor production processes. For example, high dose ion implantation processes create a harder resist. As another example, the resist often undergoes high temperature baking to obtain better anisotropic etching, but this also creates a harder resist. In yet another example, and in the context of RIE with carbon containing compounds, the resist tends to become harder to remove due to polymerization of the resist surface.

To remove the resist, dry and wet methods have been developed with varying advantages and disadvantages. Dry methods typically volatilize and remove the bulk of the resist. One such dry method uses a barrel asher which places the wafer directly in a low frequency or rf plasma. Another dry method uses a downstream asher which forms a plasma away from where the wafer is positioned. However, when a downstream or barrel asher is used alone, a residual amount of resist may remain which necessitates subsequent processing for complete removal. Alternatively, harsher conditions such as higher power and/or temperature may be needed to remove the residual resist.

Past wet methods have employed inorganic and organic solutions. A typical inorganic solution has been 2:1 H$_2$SO$_4$/H$_2$O$_2$ for the silicon industry. However, due to incompatible chemistries, that solution cannot be readily used in III–V compound semiconductors. Organic strippers have often been used in conjunction with megasonics or ultrasonics. However, the accompanying agitation aspect can be detrimental to devices with submicron features and to devices fabricated on III–V semiconductors as they are relatively brittle.

Apart from the traditional dry and wet methods directed specifically for stripping resist, there have been methods of removing sidewall polymers formed during the etching process. As noted above, and in a related fashion, etching processes may tend to polymerize the surface of the photoresist and thereby harden the resist. U.S. Pat. No. 5,567,271 generally describes an oxygen RIE plasma method for removing oxidized photoresist residue. But that disclosed method is concerned with adding hydrogen as a reducing material in a non-explosive fashion. In the context of removing sidewall polymers on deep etches (i.e., >5 $\mu$m), a series of cycles having short etch plasmas followed by oxygen clean plasmas has been used. [J. E. Schramm, "Reactive Ion Etching of Indium-Based Compounds Using Methane/Hydrogen/Argon," Dissertation, University of California, Santa Barbara, p. 67 (1995)]. However, rather than being concerned with mask removal, such method is directed towards minimizing profile degradation.

Regardless of the particular method employed, as the stripping methods have become harsher or more aggressive, the concern over the potential resulting damage to the devices has grown. This concern has been particularly so in the context of devices based on compound semiconductors and the more recent deep submicron Si-based complementary metal oxide semiconductor (CMOS) devices which tend to be surface sensitive. What is meant by a "surface sensitive" device is one which has a greater potential of deterioration in device characteristics due to adverse effects to the semiconductor surface, which may be a result of harsh stripping methods. Particular types of devices fabricated in InP or GaAs technology that would be considered surface sensitive include high electron mobility transistors (HEMTs), heterojunction bipolar transistors (HBTs) and resonant tunneling diodes (RTDS) as examples.

The increasing interest in compound semiconductors, particularly those based on InP and GaAs, is in part due to the possibility of fabricating devices with dramatically improved speed, noise and power characteristics when compared with devices in the Si system. With those substrates, CH$_4$/H$_2$/Ar has been widely used in standard RIE, as well as in electron cyclotron resonance (ECR) and magnetically enhanced RIE (MRIE). In general, the wide use of CH$_4$/H$_2$/Ar in an InP system, for example, stems from the capability of etching without etch degradation due to volatility problems associated with other chemistries. SiO$_x$ (such as SiO$_2$) and SiN$_x$ (such as Si$_3$N$_4$) have been commonly used as a dielectric mask in conjunction with CH$_4$/H$_2$/Ar as an etchant for InP and GaAs substrates. A photoresist mask, however, has not been widely used because of various reasons, including a potentially hardened top surface of the resist which results from polymerization in the carbon based CH$_4$/H$_2$/Ar RIE system. Nevertheless, when comparing the number of processing steps required for past methods of SiO$_x$ or SiN$_x$ as etch masks versus photoresist, it is apparent that the former requires more steps. Generally, more steps are required to deposit, etch, and then strip the nitride. Additional processing steps can, therefore, translate into more time and expense for a SiO$_x$ or SiN$_x$ mask when compared to a photoresist mask.

As can be seen, there is a need for an improved method of stripping photoresist used as an etch mask on substrates, such as InP and GaAs. Also needed is an improved method of stripping a mask from a substrate while reducing the number of processing steps. There is a further need for a method which can strip a photoresist mask completely (when seen under microscopic examination) from a substrate while not having to resort to aggressive dry or wet stripping methods which might otherwise cause damage to the substrate.

SUMMARY OF THE INVENTION

The present invention is directed to an improved method of stripping photoresist used as a mask in reactive ion etching. It is also directed to an improved method of minimizing the number of processing steps required to remove a patterned mask on compound semiconductors, particularly those based on InP and GaAs. Furthermore, the present invention is directed to an improved method of removing a patterned photoresist mask without having to resort to harsh conditions which might otherwise tend to damage surface sensitive semiconductors.

Specifically, the improved method of the present invention includes flood exposing the patterned photoresist with a light and cyclically exposing the photoresist with a carbon based plasma and an oxygen plasma. The step of cyclically exposing occurs after the step of flood exposing. The step of flood exposing includes the steps of preventing polymerization and/or decomposing photoactive compounds in the photoresist, while the step of cyclically exposing includes the step of cyclically removing layers of the photoresist. In a particular embodiment of $CH_4/H_2/Ar$ based RIE, the step of flood exposing occurs at a wavelength band between about 405 to 436 nm and at about 7 to 8 $J/cm^2$. The $CH_4/H_2/Ar$ is flowed at about 3/5/10 sccm, at a total pressure of about 3 mTorr, and an rf power of about 250 W over 3 minutes. The $O_2$ is flowed at about 10 sccm, 20 mTorr, 250 W over 1 minute.

These and other features, aspects and advantages of the present invention will become better understood with reference to the following description and claims.

DESCRIPTION OF THE PREFERRED EMBODIMENTS

The present invention provides a method for stripping a photoresist used as a mask on a substrate. While the present invention is generally applicable in the context of reactive ion etching (RIE), the present invention contemplates that the improved method can be utilized in other contexts, such as electron cyclotron resonance (ECR), inductively coupled plasma (ICP) and magnetically enhanced reactive ion etching (MRIE). Additionally, while a preferred embodiment is described with regard to a $CH_4/H_2/Ar$ based method of RIE, the use of other plasmas are considered to be within the scope of the present invention.

Further, while the photoresist used in the preferred embodiment is from a single commercial manufacturer, namely, Hoechst Celanese, other commercially available and non-commercially produced photoresists are within the contemplation of the invention. Even though various types of substrates can be subjected to the method of the present invention, compound semiconductors which are surface sensitive may be particularly benefited by the present invention. The semiconductors may be made of various materials while practicing the present invention, such as InP and GaAs.

Although not forming a part of the invention, the precursor steps up to the method of the present invention include obtaining a substrate, such as one made of InP and commercially available from Sumitomo, Freiberger, and AXT. The desired device layers may be grown epitaxially by any well known methods, such as by molecular beam epitaxy (MBE) or metal organic chemical vapor deposition (MOCVD). Before processing, the substrate is prepared by removing possible organic contamination and adsorbed moisture, as is known in the art. With the prepared substrate, conventional lithographic processing of that substrate occurs and does not form a part of the present invention. First, a photoresist can be coated onto the substrate. As an example, the photoresist can be AZ 1518 manufactured by Hoechst Celanese. The method of coating does not form a part of the invention; thus, various well known methods in the art, such as spraying and dipping, can be used. Nevertheless, as is known, spin coating tends to provide a relatively even thickness, as compared to the other methods. Typical thicknesses range from about 0.5 to 6.0 $\mu$m, depending upon the particular type of photoresist and the spin speed used.

The next conventional, precursor step to the present invention involves the step of soft baking the photoresist in order to achieve structural integrity of the photoresist. With an InP substrate and AZ 1518, the photoresist can be soft baked at about 100° C. for about 2 minutes on a vacuum hot plate. After soft baking, an appropriate mask for the particular type of device desired is placed over the photoresist coating. Those masks may include any conventionally manufactured chrome covered glass masks such as those produced by Align-Rite. The following precursor step to the present invention includes any well known conventional exposure of the photoresist, such as exposure by an Ultratech 1100 stepper at about 210 mJ. Thereafter, the substrate having the masked and exposed photoresist coating is placed into one of many well known developers. As an example, for the InP substrate with AZ 1518, the 351 developer made by Shipley can be used in a 1:5 volume ratio of developer to water.

With the substrate now having a patterned photoresist made in accordance with the above steps, the entire substrate is next subjected to a flood exposure by a light. As noted above, past methods have used flood exposure for deep U.V. curing to harden or make the photoresist more damage resistant through surface polymerization of the resist. To the contrary, the present invention utilizes the flood exposure to lessen or minimize the hardness of the resist by preventing polymerization and/or to enable decomposing photosensitive compounds in the photoresist. In other words, the flood exposure according to the present invention occurs in the substantial absence of hardening of the photoresist. Accordingly, the flood exposure produces a weaker resist structure and, thus, the resist becomes more susceptible to stripping.

For the flood exposure, the light utilized can but need not be limited to a specific bandwidth. In other words, the light can have a relatively broad bandwidth, as long as a significant part of the light falls within the wavelength which can expose the particular photoresist without significant U.V. curing. For example, if the patterned photoresist is made of AZ 1518, the present invention preferably flood exposes the patterned photoresist with a mercury arc lamp having a broad bandwidth filtered to about 400 to 700 nm and more preferably to about 405 to 436 nm. Notwithstanding the upper limit for the bandwidth, it can be appreciated that the wavelength used can exceed such upper limit, although its effectiveness may be significantly reduced due to the lack of photoresist sensitivity.

Additionally, it is preferable that the flood exposure occur at a sufficient intensity and/or length of time to ensure substantially complete exposure of the patterned photoresist. Such complete exposure can be visually determined by the rate and, more importantly, the amount of dissolution of the exposed photoresist in its particular developer. If the flood exposure is not substantially complete, then the photoresist will generally be harder to remove. Accordingly, in this embodiment of the invention wherein a mercury arc lamp is used on an InP substrate having an AZ 1518 resist, flood exposure preferably occurs at about 7–8 $J/cm^2$.

After the flood exposure, the substrate with the patterned resist is subjected to an oxygen ash cleaning step in any commercially manufactured plasma asher, such as that produced by Technics and Mercator Control Systems (MCS). In this embodiment, an MCS LF5 plasma asher can be used for the oxygen ash cleaning with useful parameters of about 100 W, 0.2 Torr, over about 2 minutes. Thereby, thin layers of resist that may not have been fully developed in the prior photolithgraphy process are removed. Next, the substrate is placed in a reaction chamber suitable for RIE. The reaction chamber is not a part of the present invention and can be one of many commercially available RIE reactors such as by Materials Research Corp. (MRC) and PlasmaTherm.

In the reaction chamber, the substrate is subjected to a $CH_4/H_2/Ar$ plasma in conjunction with an $O_2$ plasma, as is practiced in the art. It is known that the $O_2$ plasma is helpful in polymer removal and profile control, in addition to actually slowing the rate of polymer formation. However, the present invention utilizes the $O_2$ plasma to not only remove polymers on the resist, but also to etch the resist itself. Furthermore, the $CH_4/H_2/Ar$ plasma is cyclically used in series with a cyclical $O_2$ plasma, according to one embodiment of the invention. Thereby, the $CH_4/H_2/Ar$ plasma is first used to etch the substrate, during which time there is a tendency for polymer build up on the resist. That etching step is followed by the $O_2$ plasma, in situ, which ashes the resist polymers and etches the resist itself. The sequence of $CH_4/H_2/Ar$ and $O_2$ cycles or repeats itself a number of times. And with each cycle, a layer or portion of the resist and its polymer is cyclically removed. Of course, as the number of cycles increases, so does the amount of resist and polymer which is removed.

While the invention preferably contemplates alternating $CH_4/H_2/Ar$ etching and $O_2$ ashing, it is also within the contemplation of the invention that continuous $O_2$ ashing occur, with cyclical $CH_4/H_2/Ar$ etching. In yet another embodiment, continuous $O_2$ ashing and continuous $CH_4/H_2/Ar$ etching can occur concurrently.

Generally, the etching and ashing parameters are set based upon a balancing of substrate etching and hardening of the resist. It can be appreciated by those skilled in the art that as the $CH_4/H_2/Ar$ exposure increases in density and/or time, the resist generally increases in hardness. Thus, the substrate etching parameters should be such that the resist does not become too hard to remove. In the embodiment of cyclical etching and cyclical ashing, the $CH_4/H_2/Ar$ is preferably flowed at about 3/5/10 sccm, about 3 mTorr, with about 250 W rf power over about 3 minutes. The $O_2$ is preferably flowed at about 10 sccm, about 20 mTorr, with about 250 W rf power over about 1 minute. With the above flow parameters, the resist etch rate is about 3000 to 5000 Å/min. Based on the resist etch rate observed. The substrate etch rate, with the above parameters, is about 100 /min. Based on the resist etch rate observed it can be appreciated that the photoresist layer thickness should be adjusted for the desired amount of substrate etching. The number of required cycles can be determined with a given substrate etch rate and a known amount of substrate material to be removed. For example, with an etch rate of about 100 Å/min and 3minute $CH_4/H_2/Ar$ cycles, the removal of about 600 Å of substrate material would require 2 cycles.

Following the RIE etching, the substrate is removed from the reaction chamber and preferably moved into an oxygen plasma asher for the removal of residual resist. Various commercial plasma ashers can be used, as mentioned above. If the MCS LF5 asher is used, then the preferred operating parameters are about 250 W, about 0.2 Torr over about 5 minutes.

Next, the substrate is subjected to a bath containing a photoresist stripper or solvent in order to further remove residual resist. The selected photoresist stripper needs to be chemically compatible with the substrate, i.e., not attack or etch the substrate. Therefore, with GaAs and InP substrates, for example, piranha clean ($H_2SO_4/H_2O_2$) cannot be used. Compared to the harsher strippers, the photoresist stripper in this embodiment of the invention can be a relatively mild one. Some of the commercially available photoresist strippers which are suitable for practicing this invention include PRS 1000 by J. T. Baker and 1165 by Shipley. If PRS 1000 is used, a temperature of about 100 to 120° C. is maintained for about 30 minutes. Then, the substrate can be rinsed with water in order to remove the residual photoresist stripper. An additional oxygen barrel ashing in a plasma asher, such as the MCS LF5, preferably occurs to complete the stripping process of the invention. With the MCS LF5 asher, the parameters can be about 250 W, about 0.2 Torr over about 5 minutes. This barrel ashing step, as with the earlier barrel ashing step, occurs at relatively mild conditions to prevent damage to the substrate.

EXAMPLES

A test was conducted to examine the efficacy of stripping a photoresist by conventional means. Standard lithography was done on a GaAs substrate made by AXT. The substrate was spin coated with AZ 1518 at 4000 rpm for 30 seconds. It was then soft baked on a hot plate at 100° C. for 2 minutes. The substrate was then exposed with a mask at 210 mJ by an Ultratech 1100 stepper. A 351 developer by Shipley was used in a 1:5 volume ratio with water to develop the AZ 1518. A short descum was done in an MCS LF5 at 200 mTorr, 100 W for 2 minutes. With an MRC Aries MRIE, the substrate was then etched with $CH_4/H_2/Ar$ at flows of 3/5/10 sccm at 3 mTorr, 250 W (−80 V dc) over 6 minutes. An MCS LF5 asher was used on the substrate at 250 W, 0.2 Torr over 5 minutes. After a PRS 1000 solution bath at about 100 to 120° C. for 15 minutes, the substrate was rinsed with water. Microscopic examination in both standard and Nomarski phase contrast modes (×1000) showed significant photoresist residue around features.

The substrate from above was again placed in a PRS 1000 solution bath at about 100 to 120° C. for 30 minutes. Significant photoresist residue remained. That substrate was then put through an acetone soak for 12 hours and followed by an isopropyl alcohol rinse and a nitrogen blow dry. Residue was still observed. Further barrel ashing on that substrate at 250 W, 0.2 Torr over 20 minutes still failed to clean the surface substantially of all resist residue.

In tests conducted to determine the effect of flood exposure, standard lithography was performed on two GaAs substates made by AXT. Both substrates were spin coated with AZ 1518 at 4000 rpm for 30 seconds. The substrates were then soft baked on a vacuum hot plate at 100° C. for 2 minutes. The substrates were then exposed with a mask at 210 mJ by an Ultratech 1100 stepper. A 351 developer was used in a 1:5 volume ratio with water to develop the photoresist. One substrate was flood exposed at 7–8 $J/cm^2$ for 6 minutes by a broadband mercury arc lamp filtered to about 405 to 436 nm, while the other substrate was not flood exposed.

Next, the substrates were subjected to an MCS LF5 descum at 100 W, 0.2 Torr over 2 minutes. With the MRC Aries MRIE, the substrates were etched with $CH_4/H_2/Ar$ flows of 3/5/10 sccm at 3mTorr, 250 W (−80 V dc) over 6 minutes. That was followed by oxygen barrel ashing in the LF5 at 250 W, 0.2 Torr over 5 minutes. After a PRS 1000 solution bath at about 100 to 120° C. for 30 minutes, the substrates were rinsed with water.

By microscopic examination (×500) and Nomarski photographs, the flood exposed substrate was mostly devoid of resist residue, but still had broken pieces of residue on the substrate surface. The non-flood exposed substrate had a large distribution of resist residue. Thereafter, the substrates underwent an additional LF5 ashing at 250 W, 0.2 Torr over 5 minutes. Resist residue was still found around small features under microscopic examination (×500).

To determine the efficacy of flood exposure in combination with cycled etching, GaAs substates made by AXT were exposed to standard lithography. Specifically, the substrates were spin coated with AZ 1518 at 4000 rpm for 30 seconds. The substrates were then soft baked on a hot plate at 100° C. for 2 minutes. The substrates were then exposed with a mask at 210 mJ by the Ultratech 1100 stepper. A 351 developer was used in a 1:5 volume ratio with water to develop the AZ 1518. The substrates were flood exposed at 7–8 $J/cm^2$ by a broadband mercury arc lamp filtered to about 405 to 436 nm.

Next, the substrates were subjected to an LF5 ash cleaning at 100 W, 0.2 Torr over 2 minutes. With the MRC Aries MRIE, the substrates were etched with $CH_4/H_2/Ar$ flows of 3/5/10 sccm at 3mTorr, 250 W (−80V dc) over 3minutes. That was followed by an $O_2$ flow of 10 sccm at 20 mTorr, 250 W (−90V dc) over 1 minute. The cycle was repeated twice. The LF5 oxygen barrel asher was then used on the substrates at 250 W, 0.2 Torr over 5 minutes. After a PRS 1000 solution bath at about 100 to 120° C. for 30 minutes, the substrates were rinsed with water. An additional barrel ashing step was conducted at 250 W, 0.2 Torr over 5 minutes. By microscopic examination (×500) and Nomarski photographs, the substrates were found essentially devoid of any visual resist residue.

It should be understood, of course, that the foregoing relates to preferred embodiments of the invention and that modifications may be made without departing from the spirit and scope of the invention as set forth in the following claims.

What is claimed is:

1. In a methane-hydrogen plasma based reactive ion etching process, a method of stripping essentially all of a photoresist on a substrate after said photoresist has been subjected to soft baking and patterned image exposure, comprising the steps of:

flood exposing said photoresist with a light to prevent polymerization that otherwise tends to harden said photoresist and to enable decomposition of photosensitive compounds in said photoresist; and cyclically etching said photoresist by exposure to an oxygen plasma and said methane-hydrogen plasma, said methane-hydrogen plasma exposure causing a hardening of said photoresist and being separate from said oxygen plasma exposure, the step of cyclically etching occurring after the step of flood exposing.

2. The method of claim 1, further comprising the step of ashing polymers on said photoresist.

3. The method of claim 1, further comprising the step of dissolving said photoresist in a solvent.

4. The method of claim 1, wherein said light has a wavelength of not more than about 700 nm.

5. The method of claim 1, wherein said light has a wavelength of at least about 400 nm.

6. The method of claim 1, wherein said step of cyclically etching occurs in situ during said reactive ion etching process.

7. The method of claim 1, wherein said methane-hydrogen plasma comprises methane/hydrogen/argon.

8. In a methane/hydrogen/argon reactive ion etching process, a method of stripping essentially all of a photoresist on a substrate after said photoresist has been subjected to soft baking and patterned image exposure, comprising the steps of:

flood exposing said photoresist with a light to prevent polymerization that otherwise tends to harden said photoresist and to enable decomposition of photosensitive compounds in said photoresist;

oxygen ashing said photoresist after the step of flood exposing;

cyclically exposing said photoresist to said methane/hydrogen/argon plasma and an oxygen plasma, said methane/hydrogen/argon plasma exposure causing a hardening of said photoresist, the step of cyclically exposing occurring after the step of flood exposing.

9. The method of claim 8, wherein said substrate is a compound semiconductor.

10. The method of claim 8, wherein said substrate is selected from the group consisting of InP and GaAs.

11. The method of claim 8, wherein the step of flood exposing occurs at a wavelength not less than about 400 nm.

12. The method of claim 8, wherein the step of flood exposing occurs at about 7 to 8 $J/cm^2$.

13. The method of claim 8, wherein said methane/hydrogen/argon is present in a flow rate of about 3/5/10 sccm.

14. The method of claim 13, wherein the step of plasma exposing with said methane/hydrogen/argon occurs over about 3 minutes at about 3 mTorr and 250 W.

15. The method of claim 8, wherein said oxygen is present in a flow rate of about 10 sccm.

16. The method of claim 15, wherein the step of plasma exposing with said oxygen occurs over about 1 minute at about 20 mTorr and 250 W.

17. The method of claim 8, wherein the step of cyclically exposing comprises the step of exposing said photoresist with alternating exposures of said methane/hydrogen/argon plasma and said oxygen plasma.

18. The method of claim 8, wherein the step of cyclically exposing comprises the step of continuously exposing said photoresist with said methane/hydrogen/argon plasma.

19. The method of claim 8, wherein the step of cyclically exposing comprises the steps of continuously exposing said photoresist with said oxygen plasma and cyclically exposing said photoresist with said methane/hydrogen/argon plasma.

20. The method of claim 8, further comprising the step of dissolving said photoresist in a solvent.

21. The method of claim 8, further comprising the step of barrel ashing said photoresist.

* * * * *